United States Patent [19]

Shibuya et al.

[11] 4,411,982

[45] Oct. 25, 1983

[54] METHOD OF MAKING FLEXIBLE PRINTED CIRCUITS

[75] Inventors: Chuji Shibuya, Katano; Satoshi Kaneda, Takatsuki; Takashi Kanehisa, Osaka; Masatoshi Kondo, Hirakata; Kenji Nogawa, Izumi; Fumio Hasuike, Hirakata, all of Japan

[73] Assignee: Matsushita Electric Industrial Co., Ltd., Kadoma, Japan

[21] Appl. No.: 338,907

[22] Filed: Jan. 12, 1982

Related U.S. Application Data

[63] Continuation of Ser. No. 188,666, Sep. 19, 1980, abandoned.

[30] Foreign Application Priority Data

Sep. 26, 1979 [JP] Japan ............................... 54-124615

[51] Int. Cl.$^3$ ............................................... G03C 5/00
[52] U.S. Cl. ................................. 430/314; 156/659.1; 430/315; 430/318; 29/846
[58] Field of Search .................. 427/96, 284, 173; 156/656, 664, 659.1; 228/180 A; 430/311, 313, 314, 315, 316; 29/829, 846

[56] References Cited

U.S. PATENT DOCUMENTS

| | | |
|---|---|---|
| 3,606,679 | 9/1971 | Schroeder . |
| 4,063,993 | 12/1977 | Burns ............................. 156/659 |
| 4,259,436 | 3/1981 | Tabuchi et al. ................. 430/314 |
| 4,316,320 | 2/1982 | Nogawa et al. ................. 29/839 |
| 4,325,780 | 4/1982 | Schulz, Sr. ..................... 156/659.1 |

OTHER PUBLICATIONS

Weaver, H. A., "High Volume Production of Flexible PWBs," Western Electric Co. Inc., Richmond, Virginia, USA, pp. 1.27.1–1.27.14.

*Primary Examiner*—John E. Kittle
*Assistant Examiner*—José G. Dees
*Attorney, Agent, or Firm*—Cushman, Darby & Cushman

[57] ABSTRACT

A disclosed method of continuous making flexible printed circuits for use in radio set or the like appliances, includes punching holes in a continuous copper-film clad insulating substrate, forming photopolymer films on the faces of the copper films exposing the photopolymer film to photochemical light of a predetermined pattern, developing the exposed photopolymer film, etching the copper film utilizing remaining parts of the photopolymer film as etching masks, removing the remaining photopolymer films 40 and printing solder-resist films on selected parts. The improvement is to provide and retain selected oblong parts of said conductor metal film disposed on and parallel to longitudinal direction of the continuous substrate by, for example, covering these parts by etching-resist films. The retained oblong parts of the metal film serve to prevent shrinkage of the substrate during the conduct of further manufacturing steps thereby assuring registration of the patterns of the printed circuits and the printed solder-resist films.

9 Claims, 21 Drawing Figures

FIG. 1A Step 1 (114)
FIG. 1B
FIG. 1C Step 4 (117)

METHOD OF MAKING FLEXIBLE PRINTED CIRCUITS

This is a continuation of application Ser. No. 188,666, filed Sept. 19, 1980 (now abandoned).

BACKGROUND OF THE INVENTION

1. Field of the Invention

The present invention relates to a method of making flexible printed circuits for use in radio sets or like electronic appliances.

2. Prior Art

Hitherto, flexible printed circuits have been subjects of undesirable shrinkage due to internal stress residing in the polymer resin base film. Elucidating in detail, conventional flexible printed circuits are made by carrying out the following sequence of steps on a substrate consisting of an insulating polymer resin film, such as polyimide film and copper foils bonded on both surfaces:

punching through-holes and positioning holes, electroless plating followed by electroplating of copper on the inner surface of the through-holes, laminating a photopolymer film on the substrate, exposing the photopolymer film to a photochemical light of a predetermined pattern, developing the photopolymer film, etching the copper film where not covered by the photopolymer film, removing the photopolymer film, and screen-printing of a solder-resist film.

In the abovementioned prior art method, the steps of the forming of through-holes and positioning holes, the forming of the photoresist lamination and the forming of the solder-resist film must be made with highly accurate registrations of the corresponding position on the substrate. In order to attain such accuracy or positionings, the conventional method of making the flexible printed circuits employs, instead of working on a continuous long belt of the substrate, the technique of cutting a long belt of substrate into pieces of a predetermined length of, for example 50 to 80 cm and carries out the subsequent steps thereon. Such a way of working on determinate-length pieces of substrate is not advantageous in the viewpoint of efficiency. However, handling of a long, continuous substrate with accurate registration of the performance of the several steps thereon has been difficult because of the shrinkage in the substrate due to internal stress of the polyimide film after removal of a considerable part of the copper foils thereon to form necessary wiring pattern. If the registration is not good, many adverse problems arise such that rounds are not formed around the through-holes, a solder-resist film is not rightly printed into the through-holes thereby causing undesirable filling of solder therein, leading to insufficient mechanical and insufficient electric connections of lead wires of electronic components into the through-holes or impossibility of insertion of the lead wires into the through-holes.

SUMMARY OF THE INVENTION

The present invention aims to provide a new method of making flexible printed circuits wherein a sequence of steps to make the printed circuit can be made on a continuous belt of flexible substrate with highly accurate registrations thereon.

DESCRIPTION OF PREFERRED EMBODIMENTS

Manufacture of a flexible printed circuit in accordance with the present invention comprises the steps of:

punching at least through-holes for positioning, on a belt-like continuous flexible substrate which has at least a conductor metal film on an insulating base film, forming a circuit pattern of said conductor metal film on said substrate, including the steps of (i) forming a photopolymer film on a selected parts of a surface of said substrate, (ii) exposing said photopolymer film to a photochemical light of a predetermined pattern, (iii) developing said photopolymer film thereby obtaining a predetermined pattern of the photopolymer film covering said conductor metal film, (iv) etching parts of said conductor metal film not covered by said photopolymer film, and (v) removing said photopolymer film, and forming a solder-resist layer on selected parts of said conductor metal film the improvement wherein:

at last selected oblong parts of said conductor metal film disposed on and substantially parallel to longitudinal direction of said belt-like continuous flexible substrate are retained unetched during the steps in which substrate shrinkage in the longitudinal direction could cause registration problems.

Figures 1A, 1B:
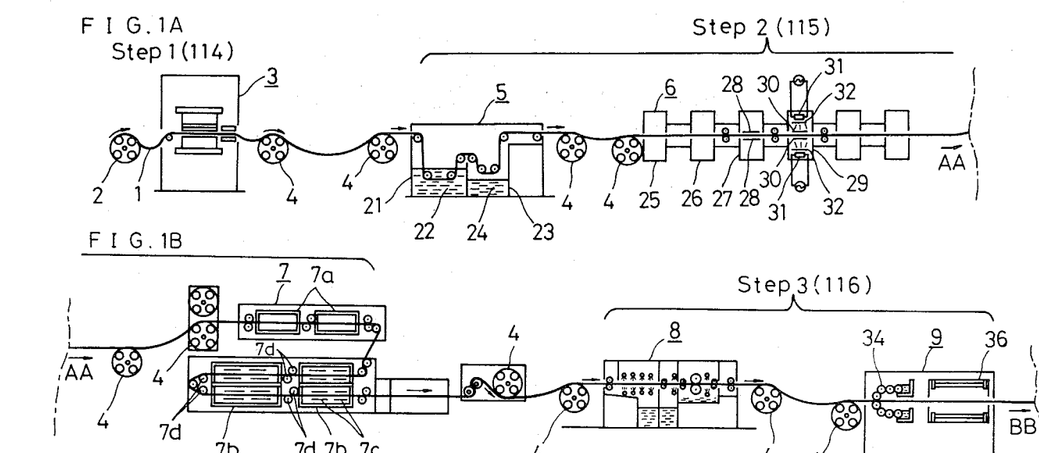
FIGS. 1A, 1B, 1C, 1D and 1E, sometimes collectively referred to herein as FIG. 1, show in schematic longitudinal vertical section five respectively successive segments in a continuous system for making flexible printed circuits in accordance with principles of the method of the present invention.
Figure 1C:
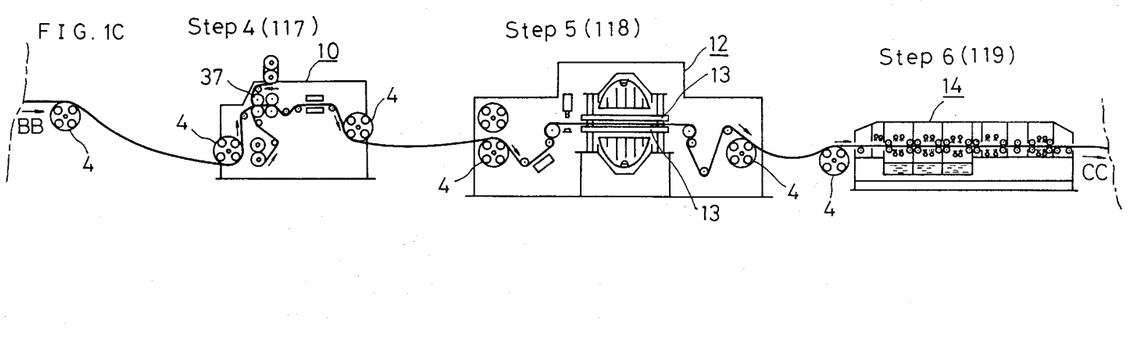
Figure 1D:
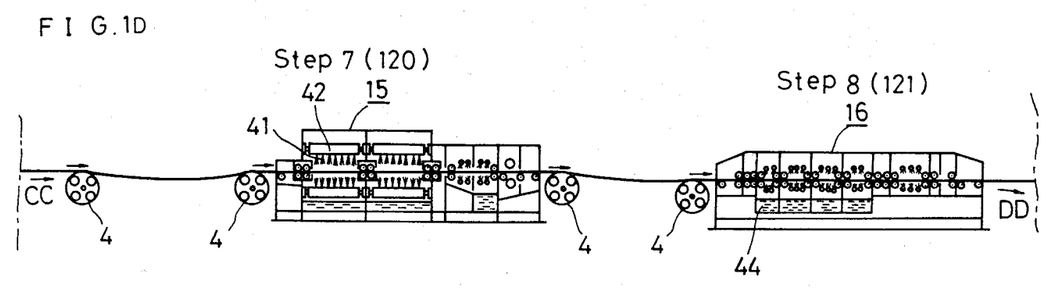
Figure 1E:
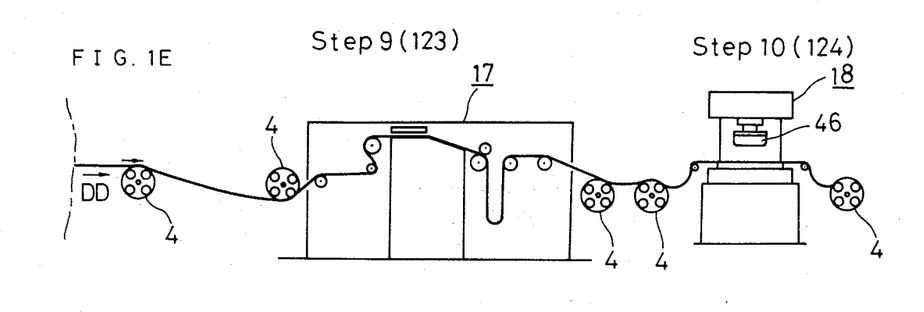
Figure 2:
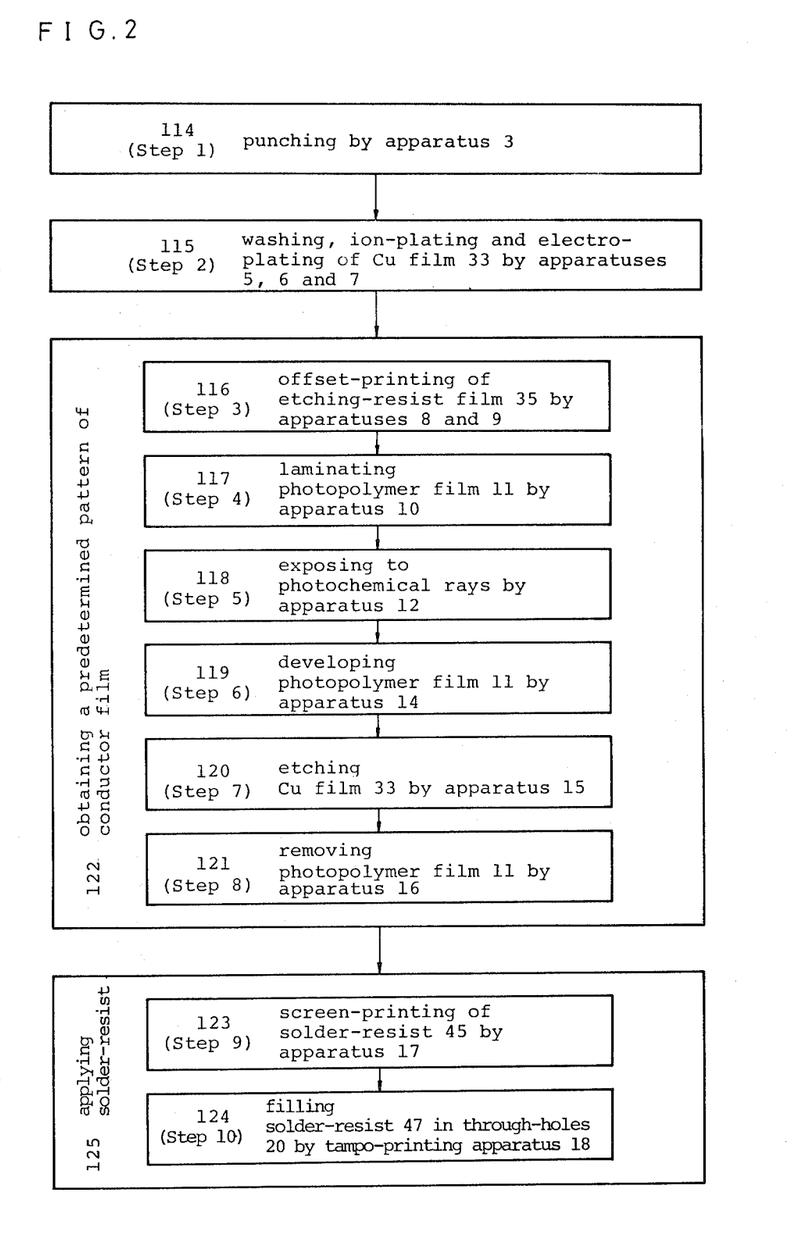
FIG. 2 is a flow chart of the system of FIG. 1.

FIGS. 1 and 2 show the general order of performance of the sequential steps of the method in accordance with the present invention. The system comprises a sequence of working apparatuses and conveying rollers 4,4, . . . in between.

The continuous belt-like flexible substrate 1 comprises an about 50 μm thick electric insulator polymer film, for example, polyimide film sandwiched between a pair of about 35 μm thick conductor foils, for example, copper foils.

First, an outline of the sequential steps of the method is elucidated referring to FIG. 1 and FIG. 2.

Figure 3:
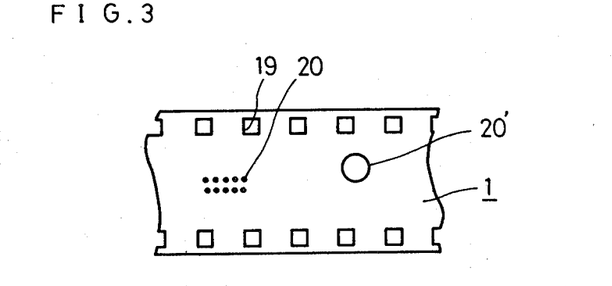
FIG. 3 is a plan view of a substrate after forming holes therethrough.
Figure 4:
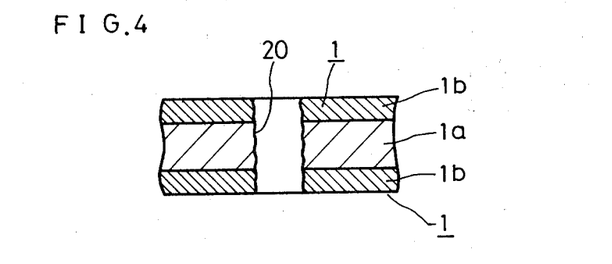
FIG. 4 is an enlarged sectional side view of the substrate of FIG. 3.

Step 1: Punching by apparatus 3 (block 114 of FIG. 2):

The belt-like continuous substrate 1 is provided in a reel 2 and fed from the reel to a punching apparatus 3 to perform the punching on the substrate 1. The punching apparatus 3 bores small through-holes 20 for inserting lead wires of electronic components therein and/or for connecting the conductor metal films on both faces, large through-holes 20' for mounting elctronic components therein and positioning-perforations 19 along the edges of the substrate 1 as shown in FIG. 3.

Figure 5:
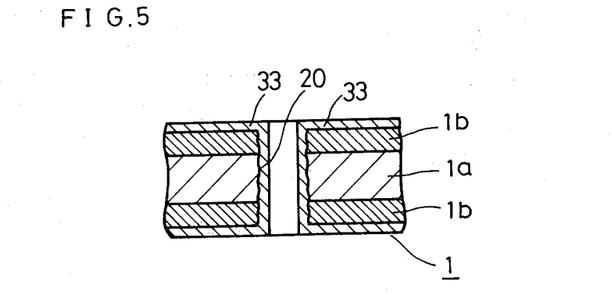
FIG. 5 is an enlarged sectional side view of the substrate after copper plating.

Step 2: Washing, ion-plating and electrochemical plating of Cu film 33 by apparatuses 5, 6 and 7 (block 115 of FIG. 2):

The continuous substrate is then led into a degreasing apparatus 5 to wash copper faces on both sides thereof, led into an ion-plating apparatus 6 to form thin copper films on the inner face of the through-holes 20 and 20', and then further led into an electrochemical plating apparatus to plate copper on the thin copper film thereby to form thick copper films 33 as shown in FIG. 5.

Figure 6:
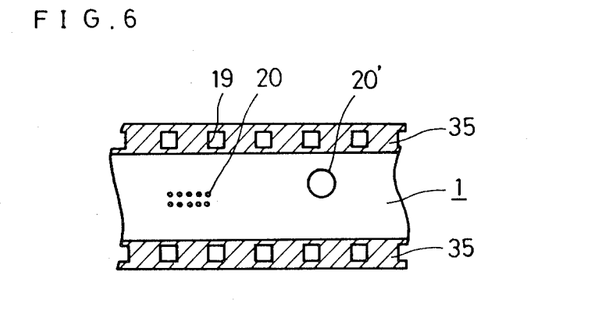
FIG. 6 is a plan view of the substrate after forming etching resist film on the edge parts of the substrate belt.

Step 3: Applying etching-resist film 35 by apparatuses 8 and 9 (block 116 of FIG. 2):

The substrate is then led into a washing apparatus 8 to wash the substrate 1 and led into an etching-resist printer 9 to print an etching-resist film 35 on both faces along the edge parts of the continuous substrate 1 as shown in FIG. 6 in belt-like oblong shapes.

Figure 7:
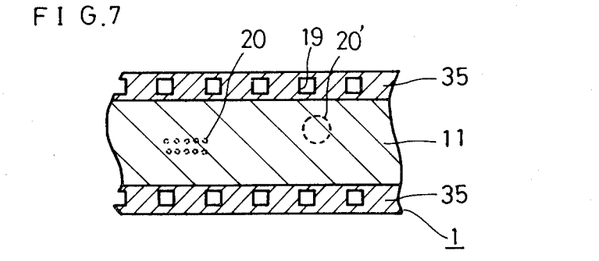
FIG. 7 is a plan view of the substrate after forming a photopolymer film on the central part which is not covered by the etching resist film.
Figure 8:
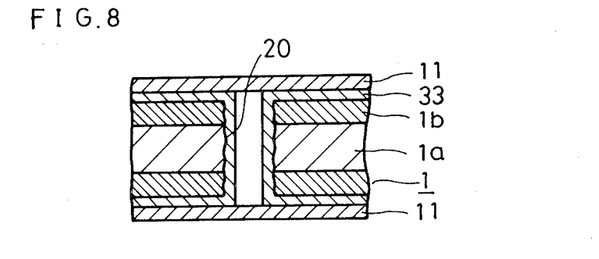
FIG. 8 is an enlarged sectional side view of the substrate of FIG. 7.

Step 4: Applying photopolymer film 11 by apparatus 10 (block 117 of FIG. 2):

The substrate is then led into a laminator apparatus 10 to apply photopolymer films 11, i.e., a photosensitive polymer resin films 11 by thermo-pressing them on both surfaces of the principal part of the substrate 1 as shown in FIG. 7 and FIG. 8.

Figure 9:
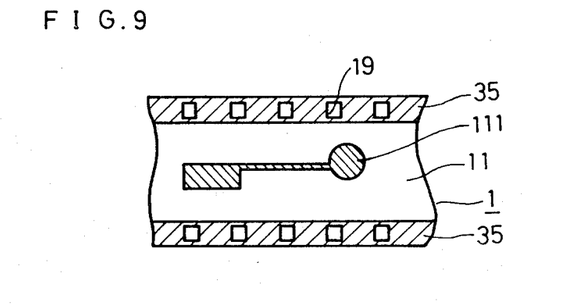
FIG. 9 is a plan view of the substrate after exposure to photochemical light of a predetermined pattern.

Step 5: Exposing to photochemical light by apparatus 12 (block 118 of FIG. 2):

The photopolymer film 11 is led in an exposure apparatus 12, wherein the photopolymer film is subject to exposure to photochemical light through negative patterns 13,13, thereby to form a latent image 111 on the photopolymer film 11 as shown by FIG. 9.

Figure 11:
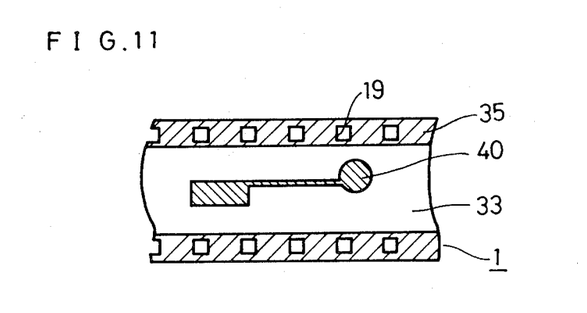
FIG. 11 is a plan view of the substrate after a development.
Figure 12:
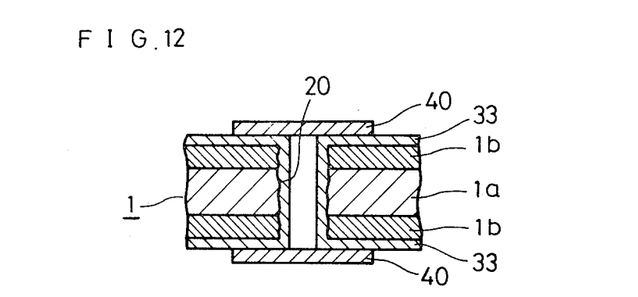
FIG. 12 is an enlarged sectional side view of the substrate of FIG. 11.

Step 6: Developing the photopolymer film 11 by apparatus 14 (block 119 of FIG. 2):

The parts of the photopolymer film 11 which are not exposed to the photochemical light are then developed by the developing apparatus 14, thereby retaining the photopolymer film 40 corresponding only to the parts of the latent image as shown by FIG. 11 and FIG. 12.

Figure 13:
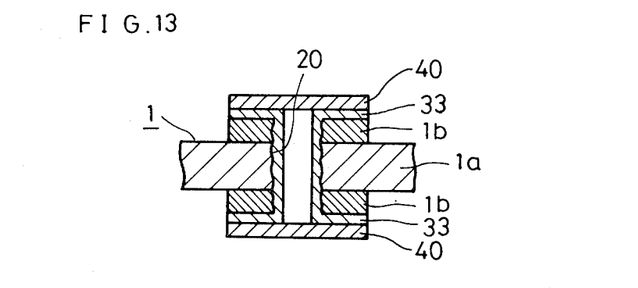
FIG. 13 is an enlarged sectional side view of the substrate after an etching.
Figure 14:
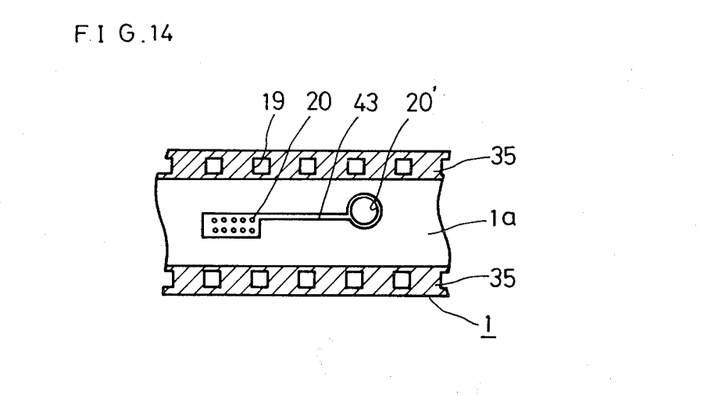
FIG. 14 is a plan view of the substrate after removal of the photopolymer film.

Step 7: Etching copper film 33 by apparatus 15 (block 120 of FIG. 2):

The substrate is subject to chemical etching in the etching apparatus 15, whereby the copper films consisting of the underlying layers 1b,1b and the overlying plated layers 33,33 are retained only at the parts which are covered by the retained photopolymer film 40 as shown by FIG. 13.

Step 8: Removing photopolymer film 11 by apparatus 16 (block 121 of FIG. 2)

Figure 15:
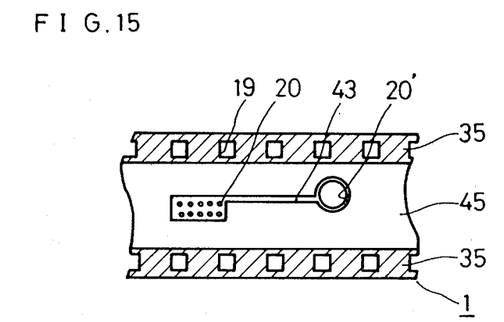
FIG. 15 is a plan view of a printed circuit which is completed by forming a solder-resist film and is ready for insertion of electronic components.

Then the substrate is sent to a photopolymer removing apparatus 16 where the photopolymer film 11 is removed by a removing agent as shown by FIG. 15.

The abovementioned step 3 to 8 form a process of forming conductor film of predetermined pattern as shown by block 122 of FIG. 2.

Step 9: Printing solder-resist films 45 by apparatus 17 (block 123 of FIG. 2)

Figure 16:
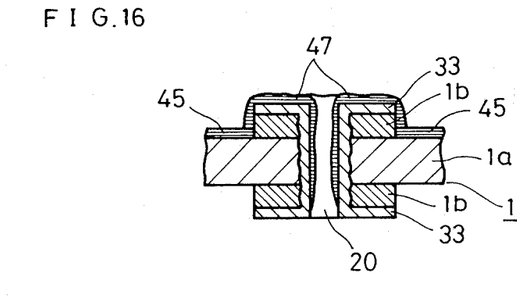
FIG. 16 is an enlarged sectional side view of the substrate of FIG. 15.

The substrate is then conveyed to a solder-resist forming apparatus 17 wherein solder-resist films 45 are formed by screen-printing on predetermined parts of the substrate as shown by FIG. 16. Also, a necessary marking of symbols, numbers or marks is printed by this apparatus. Since oblong parts of copper films with positioning perforations are retained under oblong etching-resist films 35 on the edges of the belt-shaped continuous substrate, the substrate size is accurately retained, and hence the printing can be made with a high accuracy of registration.

Step 10: Filling solder-resist 47 in through-holes 20 by apparatus 18 (block 124 of FIG. 2)

The substrate is further conveyed to a known tampo printing apparatus 18, where the solder-resist is printed into the through-holes 20,20, and on the rounds thereof as shown by FIG. 16 by means of tampos made of silicone rubber or a like elastic substance, thus completing the making of the flexible printed circuits.

The abovementioned steps 9 and 10 together form a solder-resist applying step 125 as shown in FIG. 2.

In the following, additional detailed explanations are made on the abovementioned process.

For the electric insulator polymer film of the substrate 1, such electrically insulating flexible film-forming material as polyester, polypropylene, polyimide, cellulose or the like may be used to form a substrate about 50 μm thick, and a pair of about 35 μm thick conductors, for example, copper foils is bonded on the respective two opposite faces of the electric insulator polymer film by adhesive or by thermobonding. In order to indicate positions on the continuous substate, some additional perforations may be formed or the size or shape of some of the perforations 19 may be modified so as to be distinctive of particular positions. The through-holes 20 formed in the Step 1 serve to accept lead wires therein and as well as to electrically connect the conductors 33,1b and 33,1b on both faces.

In the Step 2, the preliminary washing of the substrate is carried out in a supersonic vibration bath 21 filled with a defatting agent 22 such as dichlorodifluoroethylene, and the substrate is further cleaned by a steam of another defatting agent 24, and dried. In the ion-plating apparatus 6, the continuous substrate travels through a primary vacuum chamber 25, and a secondary vacuum chamber 25 and then enters an activation chamber 27, which is kept at a high vacuum of $5 \times 10^{-3}$ to $25 \times 10^{-3}$ Torr with argon therein. In the activation chamber 27, the substrate 1 is impressed with a voltage of $-2$ to $-4$ KV against an electrode 28 which is disposed with a gap of 2 to 5 cm to the substrate, thereby forming a glow discharge. By this glow discharging, the surfaces of the substrate are activated by collisions of argon molecules therewith. Then, the substrate is further conveyed to a next chamber, i.e., a vapor deposition chamber 29, which is kept at a high vacuum of $5 \times 10^{-3}$ to $25 \times 10^{-3}$ Torr and wherein the substrate 1 is impressed with a voltage of $-2$ to 4 KV against an electrode 30 which is disposed with a gap of 2 to 5 cm to the substrate and a vessel 31 holding a copper piece is heated to evaporate the copper piece. Thereby, a copper layer is vapor-deposited on the inner face of the through-holes 20,20 . . . of the substrate. The vapor deposition has a very slow rate of forming a metal layer. Therefore a plating is then carried out in an electrolytic plating apparatus 7, thereby quickly forming metal layers of a necessary thickness on the inner face of the through-holes 20,20 . . . . The electrochemical plating apparatus comprises a preliminary washing part 7a for defatting, water-washing, acid-washing, water-washing, a CuSO$_4$-dipping bath 7b, and a voltage feeding roller 7d, from which a negative voltage is impressed on the substrate against the anode 7c. The electrolytic plating is carried out at the current rate of 2 to 3 A/dm$^2$. Thus a copper layer of a necessary thickness is formed on the substrate.

In the step 122 of obtaining predetermined patterns of conductor films, at first, as stated in the Step 3, the substrate 1 is washed by acid in the washing apparatus 8 and dried. Then the substrate is subject to application of the etching resist-film 35 by the etching-resist printer 9. The printing is made in a manner that the etching resist-film 35 does not close the perforations 19,19 . . . .

Characteristic feature of the present invention arises in this step. That is, in contrast to the conventional method, a longitudinal or pattern or patterns of the etching resist-film 35,35, for example, a photo-hardening resin or water-repellent resin are formed on the edges of the continuous substrate 1 by means of an offset printing drum 34 of the printer 9. In the example of FIG. 6, the stripe-ike patterns 35,35 are formed to include positioning perforations 19,19 . . . or perforations. This is desirable since stripe-shaped copper film patterns are retained having the positioning perforations therein, thereby enforcing the perforation regions and increasing accuracy of the positioning. By means of the oblong etching-resist patterns 35,35 formed along the longitudinal direction of the continuous substrate, copper film stripes of the same pattern are formed on the polymer resin base film 1a. Accordingly, such longitudinal copper film stripes prevent the hitherto-observed undesirable shrinkage by 0.026 to 0.064% of the polymer resin base film 1a even after etching away of the copper film 33,1b in a predetermined pattern as required for manufacure of the circuit board. Then the etching-resist films 35,35 are exposed to a photochemical lights from a light source 36 and are hardened thereby so as to form resist-films covering the copper films thereunder to protect them during the etching process.

Thereafter, by means of a known laminator apparatus 10, photopolymer films 11 are thermo-bonded on both faces, at the central parts, of the continuous substrate. That is, the photopolymer film 11 is formed in a manner not to cover the etching-resist film 35, hence not to close the positioning perforations 19,19 . . . , as shown by FIGS. 7 and 8.

Figure 10:
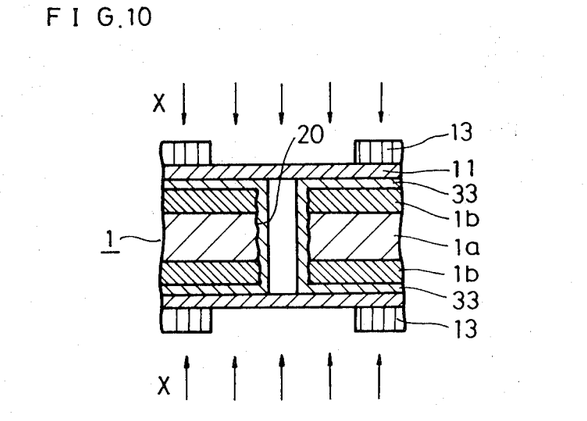
FIG. 10 is an enlarged sectional side view of the substrate of FIG. 9.

Then, the continuous substrate 1 is conveyed into the exposure apparatus 12, wherein negative patterns 13,13 are put on both surfaces of the photopolymer films 11,11, which are then subject to light exposure through the negative patterns 13,13 by photochemical light, for example, UV light X,X shown in FIG. 10 from high pressure mercury lamps.

In the Step 6, the exposed films are then developed by utilizing remaining parts of the photopolymer film 11 as etching masks in the developing apparatus 14, wherein the photopolymer films are dissolved and removed except the part covered by the part of the film exposed to the photochemical lights as shown by FIGS. 11 and 12.

Then in the Step 7, the conductor metal films exposed by the abovementioned developing of the photopolymer are subject to chemical etching. In the etching apparatus 15, the substrate 1 is showered by chemical etchant 41 from sprayers 42. By the etching, conductor metal patterns which are the same as the patterns of the exposure to photochemical lights are obtained on the surfaces of the substrate 1, as shown by FIG. 13. In this etching, of course, the oblong conductor metal films are retained along the edges of the substrate covered by protection by the etching-resist films 35,35, and these retained oblong metal films serve as an anti-shrinkage reinforcing member.

In the Step 8, the substrate is conveyed to the photopolymer removing apparatus 16, where the photopolymer films 11,11 are dissolved and removed by a solvent 44 for the photopolymer film 11. In this removing step, the oblong belt-shaped etching-resist film at the edges of the continuous substrate 1 is retained unetched when material of the etching-resist film is so selected as to be not dissolved by the solvent 44.

In the steps of the solder-resist application 125, the screen-printing (Step 9) and tampo printing (Step 10) of the solder-resist film 45 and 47, respectively, can be made very accurately, because registrations between the patterns of the screens for printing and those of the conductor films 1b,33 on the substrate 1 are achieved very accurately since shrinkage of the substrate 1 is prevented by the abovementioned retention of the oblong conductor films at the edge parts of the substrate 1.

The solder-resist film 47 formed on the inner face of the through-holes 20,20 . . . serves to prevent undesirable filling of the solder in such narrow through-holes 20,20 . . . in a subsequent solder-bath dipping step (not shown in drawing), thereby assuring high yield of accurate insertions of the lead wires of electronic components in the subsequent assembly steps (not shown in drawing).

Figure 17:
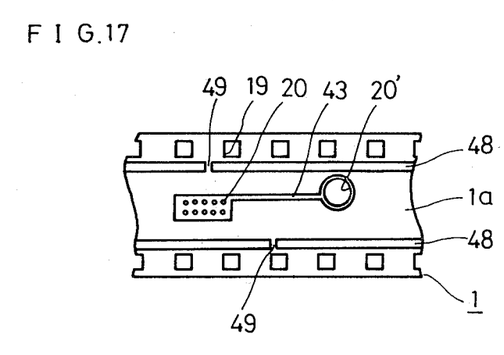
FIG. 17 is a plan view of a modified printed circuit wherein copper foil bands are formed in a different way from those of FIG. 16.

Modifications of the present invention can be made when, as shown in FIG. 17, the retained oblong conductor film 48 can be disposed at the parts other than in the perforation regions. In the example of FIG. 17, the retained oblong conductor films 48 are formed inside the perforation regions. Furthermore, the retained oblong conductor films 48 can have cuttings 49,49 if the gaps at the cuttings 49,49 are so narrow as not to have substantial adverse influence on longitudinal shrinkage of the substrate 1.

The etching-resist film 35 may be retained on the continuous substrate 1 until the continuous substrate 1 is used in an assembly line, or alternatively may be removed before the use, since that, in general, the continuous substrate 1 is used in the component insertion line as it is in the continuous mode and after insertions of electronic components thereon, solder bath dippings thereof, the substrate is cut into unit pieces and at the same time, the retained oblong conductor films are cut away, thereby to form unitary pieces for actual use in appliances.

The Step 2 of plating the inside face of the through-holes may be omitted depending on the type of the printed circuits, for example, a single-face printed circuits.

As has been elucidated in describing the examples, the method of making flexible printed circuits in accordance with the present invention can provide printed circuits of accurate size and with accurate solder-resist printings as designed, by means of preventing shrinkage of the polymer resin base of the continuous substrate by retaining enforcing metal parts on the substrate. Therefore, a high yield of successful electronic component insertions and solder dipping of the substrate is obtainable, even when a very long continuous substrate is processed in a continuous mode in an automatic assembly line, and accordingly a good efficiency of sequential step-performance and assembly can be achieved because of the continuous processing.

Furthermore, by adoption of an improved plating process of ion-plating followed by electroplating of metal such as copper, the length of the processing apparatus can be made very short in comparison with that of the conventional one.

What is claimed is:

1. In a method of making a flexible printed circuit wherein:
   (a) a flexible belt-like substrate strip of an insulating polymer resin film is provided with a layer of electrically conductive metal foil bonded on at least one face and is punched with a plurality of through holes;
   (b) a photopolymer film is formed on said layer of electrically conductive metal foil;
   (c) the photopolymer film is exposed in a predetermined pattern;
   (d) the photopolymer film is developed and is thereby removed according to said pattern;
   (e) the foil on the substrate, where it is now bare of photopolymer film in certain areas as a result of conducting step (d), is subjected to an etchant, for removing said layer of electrically conductive metal foil where it has thus been bared;
   (f) the photopolymer film is removed from where it remains in place upon the remaining pattern of electrically conductive metal foil that is to become electrical circuitry; and
   (g) a solder resist layer is formed on selected portions of the thus-bared pattern of electrically conductive metal foil that is to become electrical circuitry, an improvement for overcoming a problem which arises where the substrate strip of insulating polymeric resin film is subject to longitudinal shrinkage during processing subsequent to the conducting of step (a), in that, in conducting step (g), said selected portions where said solder resist layer is formed are inaccurately located relative to said through holes or said pattern of electrically conductive metal foil that is to become electrical circuitry, said improvement comprising:

in conducting step (e) there is left on said substrate strip of insulating polymer resin, at least one long, narrow band of said layer of electrically conductive metal in a substantially non-etched condition, of which each such band lies near and extends parallel to a respective lateral extreme of said belt-like strip of insulating polymer resin and adjacent, but separate from and laterally outside said pattern of electrically conductive metal foil that is to become electrical circuitry, so that said at least one band is available at least until the completion of the conducting of step (g), to prevent inaccurate location of said selected portions where said solder resist layer is formed by preventing longitudinal polymer film of said substrate, said at least one band being formed so as to be on the order of as long as said pattern of electrically conductive metal foil that is to become electrical circuitry, at least to the extent that said pattern of electrically conductive metal is to become one flexible printed circuit.

2. The method of claim 1, wherein:
in order to leave said at least one long, narrow non-etched band of said layer of electrically conductive material on said substrate strip when conducting step (e),
no later than when conducting steps (b)-(d), forming a respective etch-resistant layer on the layer of electrically conductive metal foil in a pattern corresponding to where the layer of electrically conductive metal foil is to remain non-etched when conducting step (e), for each such band.

3. The method of claim 1, wherein:
said pattern of electrically conductive metal foil is formed on said substrate strip of insulating polymer resin film repetitively in at least one longitudinally extending series of what can be separated by cutting across said strip subsequent to conducting step (g) to produce a plurality of like flexible printed circuits;
in conducting step (a), at least some of the through holes are formed in two longitudinal series to function as sprocket holes, each such series lying near and extending parallel to a respective lateral extreme of said belt-like strip of insulating polymer resin film and extending along what is to become a plurality of said like flexible printed circuits; and
in forming said at least one band, a respective said band is superimposed upon each series of sprocket holes on at least one face of the substrate belt-like strip of insulating polymer resin film, each band being broader than the respective series of sprocket holes, so that the sprocket holes do not divide the respective band into a series of longitudinally separated segments.

4. The method of claim 2, wherein:
each said etch-resistant layer is formed on said layer of electrically conductive foil before step (b) is conducted, and when step (b) is conducted, said photopolymer film is formed on said layer of electrically conductive metal foil where said layer of electrically conductive metal foil is not already covered by a said etch-resistant layer.

5. The method of claim 1, wherein:
in conducting step (a) a said layer of electrically conductive metal foil is bonded on each face of said substrate strip of insulating polymer resin film; and
prior to conducting step (b) at least some of said through holes corresponding to locations in said pattern of electrically conductive metal foil that is to become electrical circuitry are plated-through with electrically conductive metal electrically joining said layers of electrically conductive metal foil on the opposite faces of said substrate of insulating polymer resin film through each such through hole, while preserving that through hole in an open condition.

6. The method of claim 5, wherein:

in order to leave said at least one long, narrow non-etched band of said layer of electrically conductive material on said substrate strip when conducting step (e), no later than when conducting steps (b)–(d), forming a respective etch-resistant layer on the layer of electrically conductive metal foil in a pattern corresponding to where the layer of electrically conductive metal foil is to remain non-etched when conducting step (e), for each such band.

7. The method of claim 5, wherein:

said pattern of electrically conductive metal foil is formed on said substrate strip of insulating polymer resin film repetitively in at least one longitudinally extending series of what can be separated by cutting across said strip subsequent to conducting step (g) to produce a plurality of like flexible printed circuits;

in conducting step (a), at least some of the through holes are formed in two longitudinal series to function as sprocket holes, each such series lying near and extending parallel to a respective lateral extreme of said belt-like strip of insulating polymer resin film and extending along what is to become a plurality of said like flexible printed circuits; and in forming said at least one band, a respective said band is superimposed upon each series of sprocket holes on at least one face of the substrate belt-like strip of insulating polymer resin film, each band being broader than the respective series of sprocket holes, so that the sprocket holes do not divide the respective band into a series of longitudinally separated segments.

8. The method of claim 5, wherein:

each said etch-resistant layer is formed on said layer of electrically conductive foil before step (b) is conducted, and when step (b) is conducted, said photopolymer film is formed on said layer of electrically conductive metal foil where said layer of electrically conductive metal foil is not already covered by a said etch-resistant layer.

9. The method of claim 1, wherein:

said pattern of electrically conductive metal foil is formed on said substrate strip of insulating polymer resin film repetitively in at least one longitudinally extending series of what can be separated by cutting across said strip subsequent to conducting step (g) to produce a plurality of like flexible circuits;

in conducting step (a), at least some of the through holes are formed in two longitudinal series to function as sprocket holes, each such series lying near and extending parallel to a respective lateral extreme of said strip of insulating polymer resin film and extending along what is to become a plurality of said like flexible printed circuits; and in forming said at least one band, a respective said band is formed laterally between a respective said longitudinal series of sprocket holes and said pattern of electrically conductive material that is to become electrical circuitry.

* * * * *